(12) United States Patent
Hiraki et al.

(10) Patent No.: US 10,319,865 B2
(45) Date of Patent: Jun. 11, 2019

(54) PRESSURE DETECTING APPARATUS AND METHOD OF DRIVING THE SAME

(71) Applicant: LG Display Co., Ltd., Seoul (KR)

(72) Inventors: Katsuyoshi Hiraki, Tokyo (JP); Osamu Sato, Tokyo (JP); Kazuki Watanabe, Tokyo (JP)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/683,562

(22) Filed: Aug. 22, 2017

(65) Prior Publication Data

US 2018/0061999 A1 Mar. 1, 2018

(30) Foreign Application Priority Data

Aug. 29, 2016 (JP) ................. 2016-166596

(51) Int. Cl.
| | |
|---|---|
| *H01L 29/84* | (2006.01) |
| *G06F 3/041* | (2006.01) |
| *G06K 9/00* | (2006.01) |
| *G06F 3/038* | (2013.01) |
| *G01L 1/16* | (2006.01) |
| *G01L 1/20* | (2006.01) |
| *G01L 19/00* | (2006.01) |
| *H01L 51/05* | (2006.01) |

(52) U.S. Cl.
CPC ............... *H01L 29/84* (2013.01); *G01L 1/16* (2013.01); *G01L 1/205* (2013.01); *G01L 19/0092* (2013.01); *G06F 3/038* (2013.01); *G06F 3/0416* (2013.01); *G06K 9/0002* (2013.01); *G06K 9/0004* (2013.01); *H01L 51/0508* (2013.01)

(58) Field of Classification Search
CPC ....... H01L 29/84; H01L 51/0508; G01L 1/16; G01L 1/205; G01L 19/0092
See application file for complete search history.

(56) References Cited

U.S. PATENT DOCUMENTS

| | | | | |
|---|---|---|---|---|
| 5,463,588 A | * | 10/1995 | Chonan .................. | G11C 5/147 365/189.09 |
| 6,011,273 A | * | 1/2000 | Ichikawa ................ | G01L 1/205 257/233 |
| 2005/0231991 A1 | * | 10/2005 | Horiguchi .............. | G11C 5/063 365/63 |

(Continued)

FOREIGN PATENT DOCUMENTS

JP H10-70287 A 3/1998

*Primary Examiner* — Charles D Garber
*Assistant Examiner* — S M Sohel Imtiaz
(74) *Attorney, Agent, or Firm* — Seed Intellectual Property Law Group LLP

(57) ABSTRACT

A pressure detecting includes a plurality of sensing cells arranged a plurality of rows and columns, each of the plurality of sensing cells including a pressure sensing element and a selection transistor. First driving signal lines are disposed in the rows, and the first driving signal lines are connected to the selection transistors of a first portion of the plurality of sensing cells in a respective row. Second driving signal lines are disposed in a portion of the plurality of rows, and the second driving signal lines are connected to the selection transistors of a second portion of the plurality of sensing cells in a respective row. First and second driving circuits are respectively connected to the first driving signal lines the second driving signal lines.

17 Claims, 5 Drawing Sheets

(56) References Cited

U.S. PATENT DOCUMENTS

| | | | |
|---|---|---|---|
| 2006/0181917 A1* | 8/2006 | Kang | G11C 7/065 |
| | | | 365/149 |
| 2006/0262055 A1* | 11/2006 | Takahara | H01L 27/14643 |
| | | | 345/81 |
| 2008/0030433 A1* | 2/2008 | Chen | H01L 27/3276 |
| | | | 345/76 |
| 2009/0256815 A1* | 10/2009 | Westerinen | G06F 3/044 |
| | | | 345/174 |
| 2010/0045631 A1* | 2/2010 | Chen | G06F 3/0416 |
| | | | 345/174 |
| 2010/0109702 A1* | 5/2010 | Sakata | G11C 5/147 |
| | | | 326/34 |
| 2010/0253614 A1* | 10/2010 | Chen | G01J 1/32 |
| | | | 345/102 |
| 2010/0277444 A1* | 11/2010 | Lee | G09G 3/3648 |
| | | | 345/204 |
| 2011/0309415 A1* | 12/2011 | Ng | G01L 1/005 |
| | | | 257/254 |
| 2012/0018827 A1* | 1/2012 | Kestelli | G01D 5/54 |
| | | | 257/427 |
| 2012/0113016 A1* | 5/2012 | Lin | G06F 3/0416 |
| | | | 345/173 |
| 2014/0198067 A1* | 7/2014 | Jeon | G06F 3/0416 |
| | | | 345/173 |
| 2015/0268783 A1* | 9/2015 | Yoon | G06F 3/0414 |
| | | | 345/173 |
| 2015/0346903 A1* | 12/2015 | O'Connor | G09G 5/003 |
| | | | 345/173 |
| 2016/0189609 A1* | 6/2016 | Seo | G09G 3/3233 |
| | | | 345/211 |
| 2016/0322443 A1* | 11/2016 | Her | H01L 27/1255 |
| 2016/0328593 A1* | 11/2016 | Ho | G06K 9/0002 |
| 2017/0199616 A1* | 7/2017 | Kim | G09G 3/3233 |

* cited by examiner

PRESSURE DETECTING APPARATUS AND METHOD OF DRIVING THE SAME

This application claims the benefit under 35 U.S.C. § 119(a) of Japanese Patent Application No. 2016-166596, filed on Aug. 29, 2016, in the Japanese Intellectual Property Office, which is incorporated herein by reference in its entirety.

BACKGROUND

Technical Field

The present disclosure relates to a pressure detecting apparatus, and more particularly, to a pressure detecting apparatus where first driving signal lines are connected to a first portion of sensing cells and second driving signal lines are connected to a second portion of sensing cells, and a method of driving the pressure detecting apparatus.

Description of the Related Art

A pressure detecting apparatus where small pressure sensing elements are arranged in a 2-dimensional array may measure a pressure distribution. In such a pressure detecting apparatus, similarly to a driving of pixels in an image display panel, the pressure sensing elements are driven in an active matrix type by using a thin film transistor (TFT). For example, such a pressure detecting apparatus may be described in Japanese Patent Publication No. H10-070287.

In an active matrix type 2-dimensional pressure detecting apparatus, a targeted pressure sensing element is sequentially changed by switching an active gate line using a shift register to obtain a 2-dimensional pressure distribution data.

However, when a 2-dimensional data of a pressure changing according to a time is measured, circuits such as a control circuit and a detecting circuit always operate regardless of a pressure input and a power is continuously consumed. As a result, power consumption in a state of no pressure input increases. Specifically, the increase in power consumption becomes a greater problem in a pressure detecting apparatus driven by a battery.

BRIEF SUMMARY

Embodiments relate to a pressure detecting apparatus where a power consumption in a state of no pressure input is reduced and a method of driving the pressure detecting apparatus.

One or more embodiments relate to a pressure detecting apparatus including a plurality of sensing cells and a plurality of driving signal lines and a method of driving the pressure detecting apparatus.

In one embodiment, the present disclosure provides a pressure detecting apparatus that includes: a plurality of sensing cells arranged in a 2-dimensional array having a plurality of rows and a plurality of columns, each of the plurality of sensing cells including a pressure sensing element and a selection transistor coupled to the pressure sensing element; a plurality of first driving signal lines disposed in the plurality of rows, respectively, each of the first driving signal lines connected to the selection transistors of a first portion of the plurality of sensing cells in a respective row; a plurality of second driving signal lines disposed in a portion of the plurality of rows, each of the second driving signal lines connected to the selection transistors of a second portion of the plurality of sensing cells in a respective row; a first driving circuit connected to the plurality of first driving signal lines, the first driving circuit individually supplying a respective first driving signal to the first signal line of each row; and a second driving circuit connected to the plurality of second driving signal lines, the second driving circuit concurrently supplying a second driving signal to each of the plurality of second driving signal lines.

In another embodiment, the present disclosure provides a method of driving a pressure detecting apparatus that includes a plurality of sensing cells disposed in a 2-dimensional array having a plurality of rows and a plurality of columns, each of the plurality of sensing cells including a pressure sensing element and a selection transistor coupled to the pressure sensing element, a plurality of first driving signal lines disposed in the plurality of rows, respectively, each of the first driving signal lines connected to the selection transistors of a first portion of the plurality of sensing cells in a respective row, a plurality of second driving signal lines disposed in a portion of the plurality of rows, each of the second driving signal lines connected to the selection transistors of a second portion of the plurality of sensing cells in a respective row, a first driving circuit connected to the plurality of first driving signal lines, the first driving circuit operable to individually supply a respective first driving signal to the first signal line of each row, and a second driving circuit connected to the plurality of second driving signal lines, the second driving circuit operable to concurrently supply a second driving signal to each of the plurality of second driving signal lines, the method including: operating the pressure detecting apparatus in a first driving mode by sequentially driving a plurality of first driving signal lines by the first driving circuit when at least one of the pressure sensing cells senses a pressure change; and operating the pressure detecting apparatus in a second driving mode by concurrently driving the plurality of second driving signal lines by the second driving circuit when the pressure sensing cells do not sense the pressure change.

In yet another embodiment, the present disclosure provides a device that includes: an array of pressure sensing cells arranged in a plurality of rows and columns, each of the pressure sensing cells including a pressure sensing element and a selection transistor, the selection transistor having a control terminal and first and second conduction terminals, the first conduction terminal coupled to the pressure sensing element; a first driving circuit; a second driving circuit; a plurality of first driving lines, each of the first driving lines positioned in a respective row of the plurality of rows, the first driving lines coupled between the first driving circuit and respective control terminals of the selection transistors of a first portion of the pressure sensing cells; a plurality of second driving lines coupled between the second driving circuit and respective control terminals of the selection transistors of a second portion of the pressure sensing cells; a plurality of output lines, each of the output lines disposed in a respective column of the plurality of columns and coupled to the second conduction terminals of the selection transistors in the respective column; and a pressure detection circuit coupled to the plurality of output lines, the pressure detection circuit receives output signals from the pressure sensing cells via the output lines.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

It is to be understood that both the foregoing general description and the following detailed description are explanatory, and are intended to provide further explanation of the embodiments as claimed.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
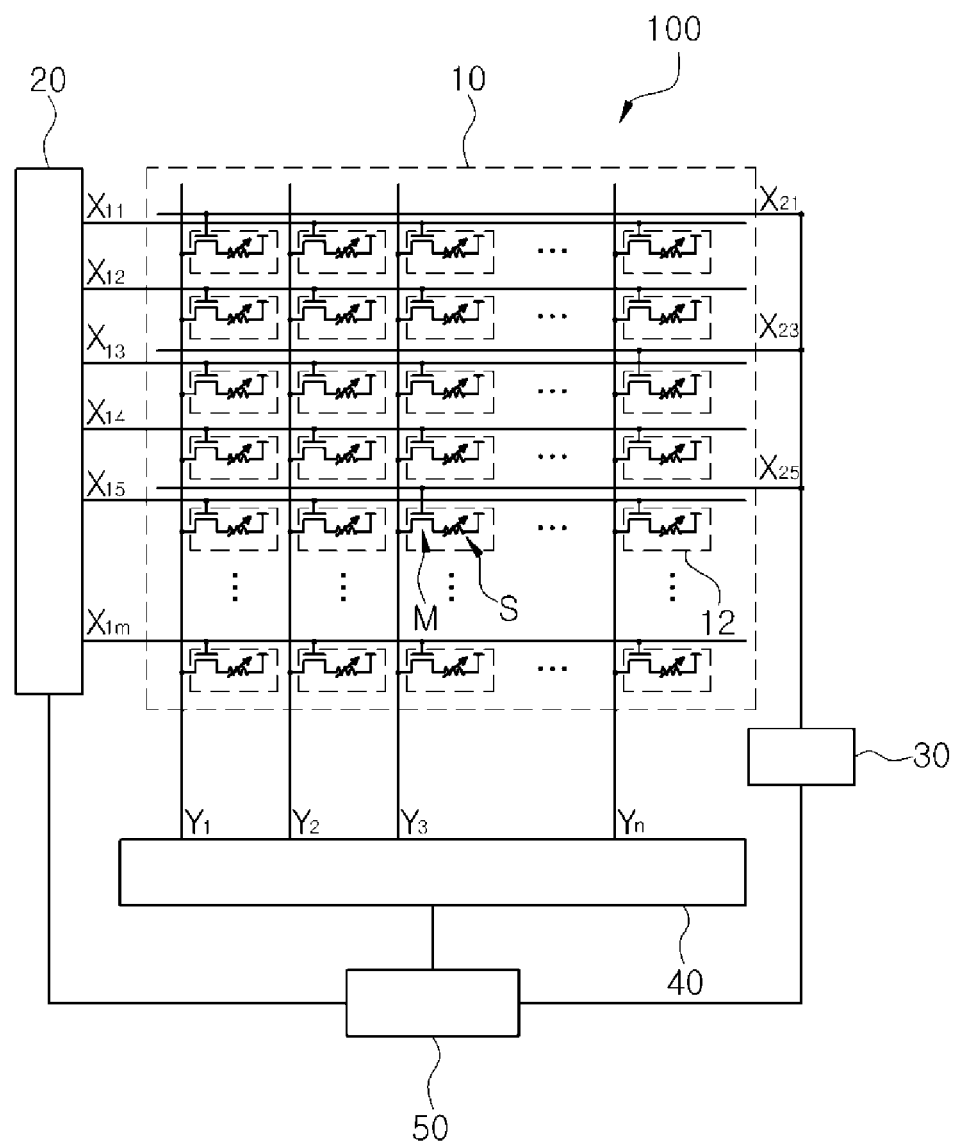
FIG. 1 is schematic diagram showing a pressure detecting apparatus according to one or more embodiments of the present disclosure.

Reference will now be made in detail to embodiments of the present disclosure, examples of which are illustrated in the accompanying drawings. In the following description, when a detailed description of well-known functions or configurations related to this disclosure may unnecessarily obscure the description of embodiments provided herein, then the detailed description of such well-known functions or configurations may be omitted. The progression or sequence of processing steps and/or operations described herein are provided merely as examples; however, the progression or sequence of steps and/or operations are not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

A pressure detecting apparatus and a method of driving the pressure detecting apparatus according to embodiments of the present disclosure will be illustrated with reference to FIGS. 1 to 3.

Figure 2:
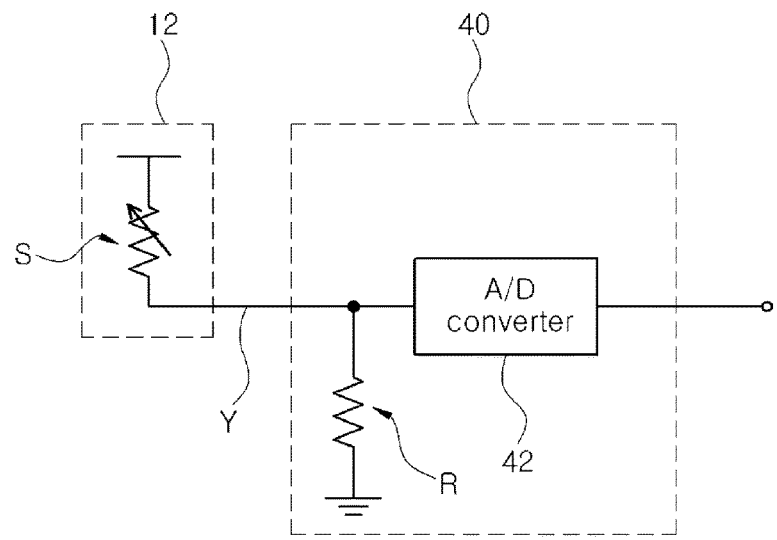
FIG. 2 is a schematic diagram showing a detecting circuit of a pressure detecting apparatus according to embodiments of the present disclosure.
Figure 3:
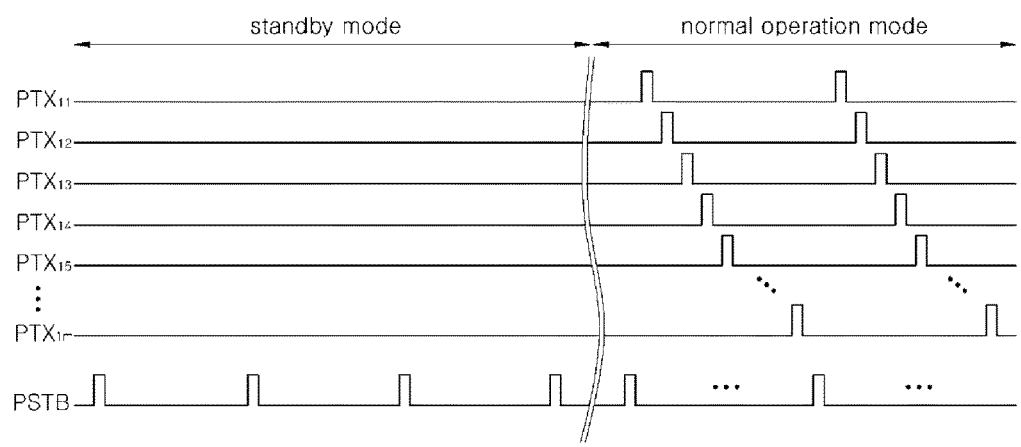
FIG. 3 is a waveform diagram showing a method of a driving a pressure detecting apparatus according to embodiments of the present disclosure

FIG. 1 is schematic diagram showing a pressure detecting apparatus according to one or more embodiments of the present disclosure, FIG. 2 is a schematic diagram showing a detecting circuit of a pressure detecting apparatus according to embodiments of the present disclosure, and FIG. 3 is a waveform diagram showing a method of a driving the pressure detecting apparatus shown in FIG. 1, in accordance with embodiments of the present disclosure.

In FIG. 1, a pressure detecting apparatus 100 according to embodiments of the present disclosure is a 2-dimensional pressure sensor including a sensor array 10, a vertical scanning circuit 20, a voltage supplying circuit 30, a detecting circuit 40 and a control circuit 50.

The sensor array 10 includes a plurality of sensing cells 12 arranged in a 2-dimensional array including a plurality of rows (e.g., m rows) and a plurality of columns (e.g., n columns). Each cell 12 includes a selection transistor M and a pressure sensing element S. The selection transistor M may be, for example, a thin film transistor (TFT). In addition, the pressure sensing element S may include a pair of electrodes and a pressure sensing material between the pair of electrodes. The pressure sensing element S may have a resistance that changes according to a pressure input between the pair of electrodes. A conductive rubber may be used as the pressure sensing material.

A first driving signal line $X_1$ is disposed along a first direction in each row of the sensor array 10. The first driving signal lines $X_1$ in the first to mth rows are represented by $X_{11}$ to $X_{1m}$ in FIG. 1. The first driving signal lines $X_{11}$ to $X_{1m}$ are connected to the vertical scanning circuit 20, which may be referred to herein as a "first driving circuit." The first direction may be a horizontal direction, as shown in FIG. 1.

A second driving signal line $X_2$ is disposed along the first direction in some of the rows of the sensor array 10. For example, the second driving signal lines $X_2$ may be disposed in the first, third and fifth rows and are represented by $X_{21}$, $X_{23}$ and $X_{25}$, as shown in FIG. 1. The rows where the second driving signal lines $X_2$ are disposed may correspond to at least one of the plurality of rows. For example, the rows where the second driving signal lines $X_2$ are disposed may be selected according to a desired detection sensitivity in a standby mode. The second driving signal lines $X_{21}$, $X_{23}$ and $X_{25}$ are connected to the voltage supplying circuit 30, which may be referred to herein as a "second driving circuit."

An output signal line Y is disposed along a second direction in each column of the sensor array 10. The second direction may be transverse to the first direction, and may be perpendicular to the first direction. The second direction may be a vertical direction, as shown in FIG. 1. The output signal lines Y in the first to nth columns are represented by $Y_1$ to $Y_n$ in FIG. 1. The output signal lines $Y_1$ to $Y_n$ are connected to the detecting circuit 40.

One terminal of the pressure sensing element S of each sensing cell 12 is connected to a source voltage line and the other terminal of the pressure sensing element S of each sensing cell 12 is connected to a drain electrode of the selection transistor M. A source electrode of the selection transistor M is connected to the output signal line Y in the corresponding column and a gate electrode of the selection transistor M is connected to one of the first and second driving signal lines $X_1$ and $X_2$ in the corresponding row. For example, the sensing cell 12 in the first row and the first column, the sensing cell in the third row and the nth column and the sensing cell 12 in the fifth row and the third column may be connected to second driving signal line $X_2$, and the other sensing cells 12 may be connected to the first driving signal line $X_1$.

The number of the sensing cells 12 connected to a second driving signal line $X_2$ may be equal to or less than 1 in each column. For example, the column such as the second column of FIG. 1 may not include any sensing cells 12 connected to a second driving signal line $X_2$. The number of the sensing cells 12 connected to the second driving signal line $X_2$ may be equal to or greater than 1 in one row. In addition, the row such as the second, fourth and mth row of FIG. 1 may not include the sensing cell 12 connected to the second driving signal line $X_2$.

The vertical scanning circuit 20 may include a decoder and a shift register. In addition, the vertical scanning circuit 20 may supply first driving signals $PTX_{11}$ to $PTX_{1m}$ (FIG. 3) to the first driving signal lines $X_{11}$ to $X_{1m}$, respectively. The first driving signals $PTX_1$ are used for the selection transistors M connected to the first driving signal lines $X_1$. As a result, the vertical scanning circuit 20 is a circuit for driving the selection transistors M. For example, when the selection transistors M have a negative (N) type, the selection transistors M in the row corresponding to the first driving signal $PTX_1$ of a high level voltage have an ON state, and the selection transistors M in the row corresponding to the first driving signal $PTX_1$ of a low level voltage have an OFF state.

The voltage supplying circuit 30 may supply a second driving signal PSTB (FIG. 3) to the second driving signal lines $X_{21}$, $X_{23}$ and $X_{25}$. The second driving signal PSTB is used for the selection transistors M connected to the second driving signal lines $X_2$. As a result, the voltage supplying circuit 30 is a circuit for driving the selection transistors M connected to the second driving signal lines $X_2$. For example, when the selection transistors M have a negative (N) type, the selection transistors M in the row corresponding to the second driving signal PSTB of a high level voltage have an ON state, and the selection transistors M in the row corresponding to the second driving signal PSTB of a low level voltage have an OFF state.

The detecting circuit 40 is a circuit for detecting a voltage of the output signal lines $Y_1$ to $Y_n$. The detected voltage of the output signal lines Y may indicate whether a pressure is applied to the pressure sensing element S or not, and thus may indicate whether an object is in contact with one or more of the pressure sensing elements S. In addition, it may become possible to calculate a stress applied to the pressure sensing element S based on the voltage of the output signal lines Y. When a change of the voltage of the output signal lines Y is detected due to contact of an object to the sensor array 10, the detecting circuit 40 may output information regarding the change to the control circuit 50.

The detecting circuit 40 may have various structures, and is not limited to a specific structure. In one or more embodiments, as shown in FIG. 2, the detecting circuit 40 may include an analog/digital (A/D) converter 42 and a resistor R corresponding to each column of the sensor array 10. An input terminal of the A/D converter 42 is connected to the output signal lines Y. The resistor R is connected to a connection node between the output signal line Y and the input terminal of the A/D converter 42 and a ground voltage line. As a result, when the selection transistor M of the sensing cell 12 is turned on to have an ON state, the pressure sensing element S and the resistor R are connected to each other in series, and a voltage of the connection node between the pressure sensing element S and the resistor R is inputted to the A/D converter 42.

The control circuit 50 may be connected to the vertical scanning circuit 20, the voltage supplying circuit 30 and the detecting circuit 40. The control circuit 50 may control an operation and a timing of the vertical scanning circuit 20, the voltage supplying circuit 30 and the detecting circuit 40. The control circuit 50 may control the vertical scanning circuit 20 and the voltage supplying circuit 30 according to the information output from the detecting circuit 40, which may indicate, for example, sensed contact by an object on one or more pressure sensing elements S of the sensor array 10.

The sensing cells 12 connected to the second driving signal lines $X_2$ may be used for determining whether the object contacts the sensing array 10. As a result, it is not necessarily required to measure a 2-dimensional distribution of a pressure, and it is enough to detect a pressure change of a part of the sensor array 10. A distribution density of the sensing cells 12 for sensing whether the object contacts the sensing array 10 may be lower than a distribution density of the sensing cells 12 for sensing a surface state of the object such as an unevenness. A sensing of a high resolution is not required for the determination of the contact of the object.

In the pressure detecting apparatus 100 according to embodiments of the present disclosure, the second driving signal lines $X_2$ are connected to a portion of the sensing cells 12 of the sensor array 10. The sensing cells 12 connected to the second driving signal lines $X_2$ may be arranged with an arrangement gap between them. The arrangement gap may be determined according to a purpose of use of the pressure detecting apparatus 100. For improving a uniformity in a sensing surface, the sensing cells 12 connected to the second driving signal lines $X_2$ may be arranged with a 2-dimensional equidistance in the sensor array 10.

As shown in FIG. 3, the pressure detecting apparatus 100 may be operable in multiple driving modes, such as a standby mode and a normal operation mode. In the standby mode, the contact of the object may be sensed by driving all of the second driving signal lines $X_2$ with driving signals or pulses that are spaced intermittently. In the normal operation mode, the 2-dimensional distribution of a pressure may be measured by driving each of the first driving signal lines $X_1$ individually and in a sequential order. Thus, in the normal operation mode, the pressure detecting apparatus 100 may have a higher sensitivity and resolution of pressure detection, as pressure sensed by each of the sensing cells 12 connected to first driving signal lines $X_1$ may be individually read across the sensor array 100.

In the standby mode, the first driving signal $PTX_1$ supplied to the first driving signal lines $X_1$ from the vertical scanning circuit 20 may have a low level voltage under the control of the control circuit 50. Accordingly, sensing cells 12 connected to the first driving signal lines $X_1$ do not supply an output to corresponding output lines Y in the standby mode. In addition, the second driving signal PSTB supplied to the second driving signal lines $X_2$ from the voltage supplying circuit 30 may periodically transition from the low level voltage to a high level voltage with a predetermined time interval. All of the second driving signal lines $X_2$ may be connected to the voltage supplying circuit 30, and the voltage supplying circuit 30 concurrently supplies the second driving signal PSTB to each of the second driving signal lines $X_2$. The time interval where the pressure is sensed in the standby mode may be determined according to a purpose of use of the pressure detecting apparatus 100.

When the second driving signal PSTB has the high level voltage, the selection transistor M of the sensing cell 12 connected to the second driving lines $X_2$ has an ON state, and the pressure sensing element S is connected to the output signal line Y through the selection transistor M. When an object contacts the pressure sensing element S, a resistance of the pressure sensing element S is changed, and a voltage of the output signal line Y is changed. As a result, the contact of the object may be sensed by detecting the voltage change using the detecting circuit 40.

In the detecting circuit 40 of FIG. 2, the source voltage is divided by the pressure sensing element S and the resistor R, and a voltage at the connection node between the pressure sensing element S and the resistor R, which varies according to the variable resistance of the pressure sensing element S, is input to the A/D converter 42. Since the resistance of the pressure sensing element S is changed by the contact of the object, the voltage inputted to the A/D converter 42 is changed, and thus the contact of the object may be detected.

When the contact of the object is not sensed by the detecting circuit 40, i.e., when the voltage input to the A/D converter 42 is not changed, the pressure detecting apparatus 100 remains in the standby mode. In the standby mode, it is not necessary to sequentially drive all of the rows with tightly spaced pulses, since the standby mode operates to detect the contact of an object, and determination of a 2-dimensional pressure distribution across the sensor array 10 is not needed in the standby mode. Accordingly, power consumption is reduced in the standby mode. Further, in the standby mode, the A/D converter 42 may operate based on a clock having a lower frequency as compared with the normal operation mode. As a result, the power consumption of the A/D converter 42 may be further reduced.

When the contact of the object is sensed by the detecting circuit 40, the control circuit 50 changes the driving mode from the standby mode to the normal operation mode. In the normal operation mode, the first driving signal $PTX_1$ supplied from the vertical scanning circuit 20 to the first driving signal line $X_1$ row-sequentially transitions from a low level voltage to a high level voltage under the control of the control circuit 50. For example, as shown in FIG. 3, the first driving signals $PTX_{11}$ to $PTX_{1m}$ supplied to the first driving signal lines $X_{11}$ to $X_{1m}$ sequentially transitions from the low level voltage to the high level voltage. Accordingly, the vertical scanning circuit 20 sequentially scans the sensing cells 12 connected to the first driving signal lines $X_{11}$ to $X_{1m}$, row-by-row in the normal operation mode.

As a result, the selection transistor M of the sensing cell 12 connected to the first driving signal line $X_1$ is row-sequentially turned on to have an ON state, and a voltage corresponding to the contact of the object to the pressure sensing element S is output to the output signal line Y of each column. The 2-dimensional distribution of the pressure is measured with a high resolution by sequentially performing the operation from the first row to the mth row.

The second driving signal PSTB supplied to the second driving signal line $X_2$ transitions from the low level voltage to the high level voltage with a timing different from the first driving signal $PTX_1$ supplied to the first signal line $X_1$. For example, as shown in FIG. 3, the second driving signal PSTB transitions from the low level voltage to the high level voltage at a timing before the first driving signal $PTX_1$ begins sequentially transitioning from the low level voltage to the high level voltage in the normal operation mode. As a result, the selection transistor M of the sensing cell 12 connected to the second driving signal line $X_2$ is turned on to have an ON state, the pressure corresponding to the contact state of the object to the pressure sensing element S is outputted to the output signal line Y. Accordingly, all of the sensing cells 12 are used for the measurement of the pressure by supplying the driving signal to the second driving signal line $X_2$.

When the second driving signal PSTB transitions to the high level voltage, the plurality of second driving signal lines $X_2$ (e.g., $X_{21}$, $X_{23}$, $X_{25}$) have the high level voltage at the same time. However, since the number of the sensing cells 12 connected to the second driving signal line $X_2$ is equal to or less than 1 in each column, the selection transistors M of the plurality of sensing cells 12 in one column do not have the ON state at the same time.

When the output voltages from all of the sensing cells 12 return to a value in absence of the contact of the object, the control circuit 50 transitions from the normal operation mode to the standby mode and repeats the above operation.

In the normal operation mode, the second driving signal line $X_2$ does not have to be driven. In such a case, although the pressure is not sensed by the sensing cell 12 connected to the second driving signal line $X_2$, the sensing resolution is not significantly influenced and may be sufficient in case that the number of the sensing cells 12 connected to the second driving signal line $X_2$ is sufficiently smaller than the number of all of the sensing cells 12 in the sensor array 10.

In the embodiment where the output voltage from the sensing cell 12 connected to the second driving signal line $X_2$ is used in the normal operation mode, the number of the sensing cells 12 connected to the second driving signal line $X_2$ in each column may be equal to or less than 1. When the second driving signal line $X_2$ is not driven in the normal operation mode, the number of the sensing cells 12 connected to the second driving signal line $X_2$ in each column may be equal to or greater than 2, since these sensing cells 12 are only used to detect contact in the standby driving mode.

Figure 6:
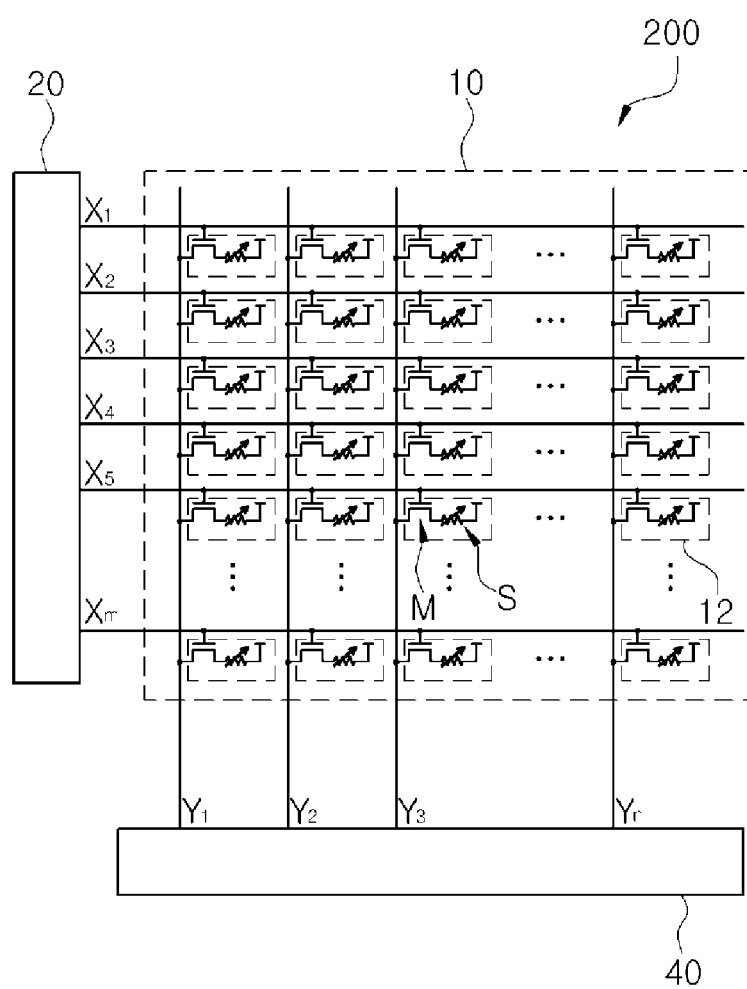
FIG. 6 is a schematic diagram showing a pressure detecting apparatus according to the related art.

For sensing the contact of the object in a pressure detecting apparatus 200 of FIG. 6, which does not include the second driving signal line $X_2$ and the voltage supplying circuit 30, it is required to measure the pressure distribution in the sensor array 10 by performing a row-sequential driving as in the normal operation mode. As a result, a reading time according to the row number of the sensor array 10 is required for the judgment of the contact of the object, and a required power consumption increases.

In the pressure detecting apparatus 100 according to one or more embodiments, the determination of the contact of the object in the sensor array 10 may be performed by one pulse driving, e.g., by the second driving signal PSTB which is concurrently provided to all of the sensing cells 12 that are connected to a second driving signal line $X_2$. As a result, when the row number of the sensor array 10 is m, a power consumption for the determination of the contact of the object may be reduced to 1/m of a power consumption of the pressure detecting apparatus 200 of FIG. 6. In addition, a time for the judgment of the contact of the object may be reduced to 1/m of a time of the pressure detecting apparatus 200 of FIG. 6.

For example, when the pressure detecting apparatus 100 is installed in a finger of a robot, the contact of the object to the finger of the robot may be quickly sensed by the standby mode operation, and the power control may be rapidly performed according to the sensing information. In the normal operation mode, the surface such as unevenness of the object that the robot contacts is accurately read from the 2-dimensional pressure distribution.

Accordingly, a power consumption in a state where a pressure is not applied is reduced without reduction of detection resolution in the normal operation mode.

A pressure detecting apparatus and a method of driving the pressure detecting apparatus according to further embodiments of the present disclosure will be illustrated with reference to FIGS. 4 and 5.

Figure 4:
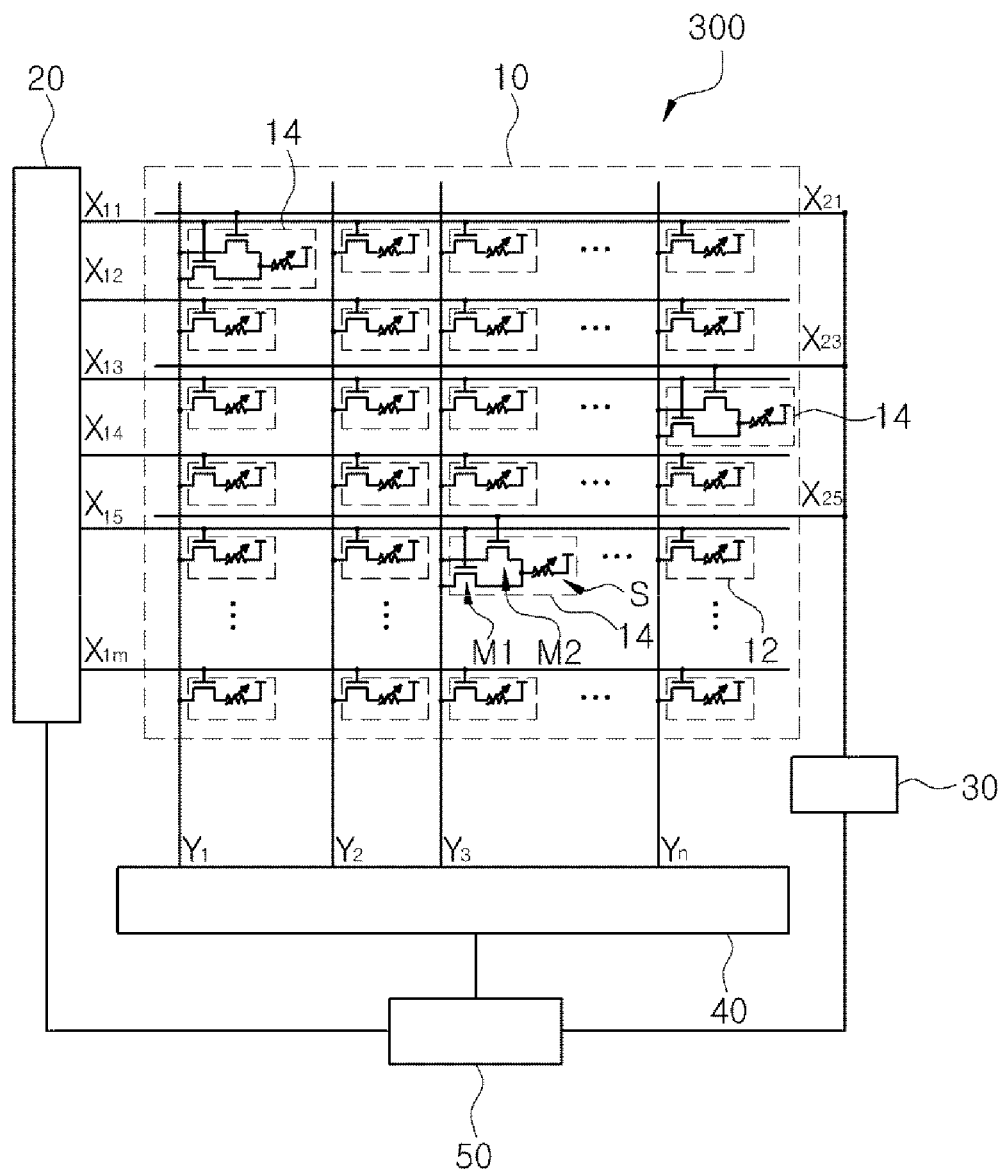
FIG. 4 is a schematic diagram showing a pressure detecting apparatus according to additional embodiments of the present disclosure.
Figure 5:
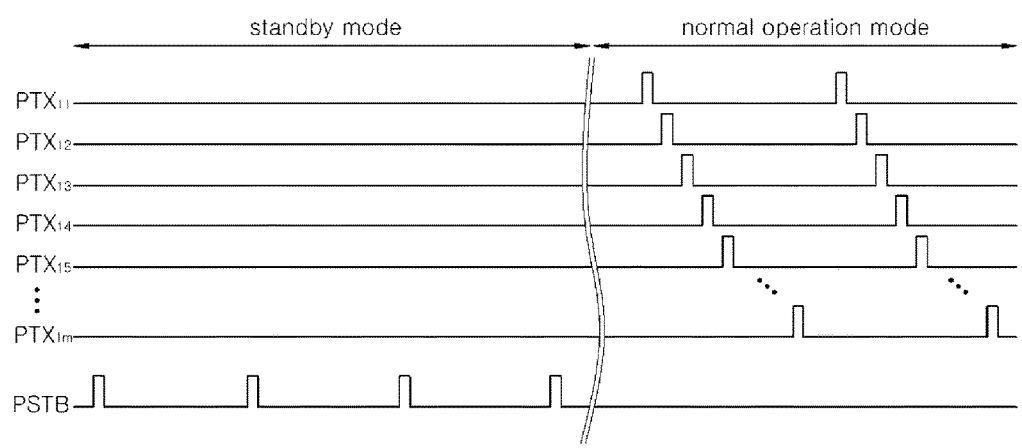
FIG. 5 is a waveform diagram showing a method of a driving a pressure detecting apparatus shown in FIG. 4, according to embodiments of the present disclosure.

FIG. 4 is a schematic diagram showing a pressure detecting apparatus according to embodiments of the present disclosure, and FIG. 5 is a waveform diagram showing a method of a driving the pressure detecting apparatus shown in FIG. 4. The parts of FIG. 4 that are the same as the parts of FIGS. 1 and 2 may be designated by the same reference number, and illustration of such same parts may be omitted or the parts may be briefly illustrated for the sake of conciseness of explanation.

In FIG. 4, a pressure detecting apparatus 300 according to embodiments of the present disclosure has the same structure as the pressure detecting apparatus 100 shown in FIG. 1, except for a second sensing cell 14 connected to the second driving signal line $X_2$.

In the pressure detecting apparatus 300, a second sensing cell 14 connected to the second driving signal line $X_2$ includes first and second selection transistors M1 and M2 and a pressure sensing element S. A first sensing cell 12 of the pressure detecting apparatus 300 may have the same structure as the sensing cell 12 shown and described with respect to FIG. 1.

One terminal of the pressure sensing element S of the second sensing cell 14 is connected to a source voltage line and the other terminal of the pressure sensing element S of the second sensing cell 14 is connected to drain electrodes of the first and second selection transistors M1 and M2. Source electrodes of the first and second selection transistors M1 and M2 are connected to the output signal line Y in the corresponding column. A gate electrode of the first selection transistor M1 is connected to the first driving signal line $X_1$ in the corresponding row, and a gate electrode of the second selection transistor $M_2$ is connected to the second driving signal lines $X_2$ in the corresponding row.

In addition, the number of the second sensing cells 14 connected to the second driving signal line $X_2$ may be equal to or less than 1 in each column.

In FIG. 5, the pressure detecting apparatus 300 according to embodiments of the present disclosure may have a standby mode and a normal operation mode as a driving mode.

In the standby mode, the first driving signal $PTX_1$ supplied to the first driving signal lines $X_1$ from the vertical scanning circuit 20 may have a low level voltage under the control of the control circuit 50. In addition, the second driving signal PSTB supplied to the second driving signal lines $X_2$ from the voltage supplying circuit 30 may periodically transition from the low level voltage to a high level voltage with a predetermined time interval.

When the second driving signal PSTB has the high level voltage, the second selection transistor M2 of the second sensing cell 14 connected to the second driving lines $X_2$ has an ON state, and the pressure sensing element S is connected to the output signal line Y through the second selection transistor M2. When an object contacts the pressure sensing element S, a resistance of the pressure sensing element S is changed, and a voltage of the output signal line Y is changed. As a result, the contact of the object may be sensed by detecting the voltage change using the detecting circuit 40.

When the plurality of second sensing cells 14 are connected to the output signal line Y, although a voltage of the output signal line Y does not become a value corresponding to the pressure applied to the pressure sensing element S, it is enough to sense the contact of the object in the standby mode.

When the contact of the object is not sensed by the detecting circuit 40, the pressure detecting apparatus 300 remains in the standby mode. In the standby mode, a driving where a pulse is changed in a relatively short time period as a row-sequential driving in the normal operation mode is not required, and a power consumption is thus reduced.

When the contact of the object is sensed by the detecting circuit 40, the control circuit 50 changes the driving mode from the standby mode to the normal operation mode. In the normal operation mode, the first driving signal $PTX_1$ supplied from the vertical scanning circuit 20 to the first driving signal line $X_1$ row-sequentially transitions from a low level voltage to a high level voltage under the control of the control circuit 50. For example, as shown in FIG. 5, the first driving signals $PTX_{11}$ to $PTX_{1m}$ supplied to the first driving signal lines $X_{11}$ to $X_{1m}$ 1 sequentially transitions from the low level voltage to the high level voltage. In addition, the driving of the second driving signal line $X_2$ is not performed.

As a result, the selection transistor M of the first sensing cell 12 and the first selection transistor M1 of the second sensing cell 14 are row-sequentially turned on to have an ON state, and a voltage corresponding to the contact of the object to the pressure sensing element S is outputted to the output signal line Y of each column. The 2-dimensional distribution of the pressure is measured with a high resolution by sequentially performing the operation from the first row to the mth row.

In the pressure detecting apparatus 300 shown in FIG. 4, the second selection transistor M2 of the sensing cell 14 is used in the standby mode, and the first selection transistor M1 of the sensing cell 14 is used in the normal operation mode. As a result, the first selection transistors M1 of the plurality of second sensing cells 14 in one column are not turned on at the same time even when the plurality of second sensing cells 14 are disposed in one column.

When the output voltages of all of the first sensing cells 12 return to a value in absence of the contact of the object, the control circuit 50 transitions from the normal operation mode to the standby mode and repeats the above operation.

In the pressure detecting apparatus 300 shown in FIG. 4, the determination of the contact of the object in the sensor array 10 may be performed by one pulse driving. As a result, when the row number of the sensor array 10 is m, a power consumption for the judgment of the contact of the object may be reduced to 1/m of a power consumption of the pressure detecting apparatus 200 of FIG. 6. In addition, a time for the determination of the contact of the object may be reduced to 1/m of a time of the pressure detecting apparatus 200 of FIG. 6.

Accordingly, a power consumption in a state where a pressure is not applied is reduced without reduction of detection resolution in the normal operation mode.

Various modifications may be made to the pressure detecting apparatus 300 according to the present disclosure.

For example, although the first driving signal lines $X_1$ are row-sequentially driven in the normal operation mode of embodiments provided herein, the driving of all rows may not be required in one or more embodiments.

In addition, although the pressure detecting apparatus 300 may be installed on the finger of a robot in the various embodiments described herein, the pressure detecting apparatus may be installed on various equipments requiring measurement of the 2-dimensional distribution of pressure and the touch sensing function in another embodiment. For example, the pressure detecting apparatus may be applied to a touch panel of an in-cell touch display device.

Consequently, a power consumption in a state where a pressure is not applied is reduced without reduction of detection resolution in the normal operation mode.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pressure detecting apparatus, comprising:
a plurality of sensing cells arranged in a 2-dimensional array having a plurality of rows and a plurality of columns, each of the plurality of sensing cells including a pressure sensing element and a selection transistor coupled to the pressure sensing element;
a plurality of first driving signal lines disposed in the plurality of rows, respectively, each of the first driving signal lines connected to the selection transistors of a first portion of the plurality of sensing cells in a respective row;
a plurality of second driving signal lines disposed in a portion of the plurality of rows, each of the second driving signal lines connected to the selection transistors of a second portion of the plurality of sensing cells in a respective row;
a first driving circuit connected to the plurality of first driving signal lines, the first driving circuit individually supplying a respective first driving signal to the first signal line of each row; and
a second driving circuit connected to the plurality of second driving signal lines, the second driving circuit concurrently supplying a second driving signal to each of the plurality of second driving signal lines.

2. The pressure detecting apparatus of claim 1, further comprising a control circuit that selectively controls an operation of the pressure detecting apparatus in a first driving mode and a second driving mode, wherein in the first driving mode, the plurality of first driving signal lines are sequentially driven by the first driving circuit, and in the second driving mode, the plurality of second driving signal lines are concurrently driven by the second driving circuit.

3. The pressure detecting apparatus of claim 2, wherein the control circuit switches the operation of the pressure detecting apparatus from the second driving mode to the first driving mode when at least one of the pressure sensing elements connected to the second driving signal lines senses a pressure change.

4. The pressure detecting apparatus of claim 2, wherein the control circuit causes the second driving circuit to drive the plurality of second driving signal lines based on a predetermined time interval.

5. The pressure detecting apparatus of claim 2, wherein the control circuit switches the operation of the pressure detecting apparatus from the second driving mode to the first driving mode when at least one of the pressure sensing elements connected to the second driving signal lines senses a pressure change.

6. The pressure detecting apparatus of claim 2, wherein in the first driving mode, the control circuit drives the second driving lines in synchronization with the first driving signal lines.

7. The pressure detecting apparatus of claim 1, wherein the sensing cells connected to the second driving signal lines are equidistant from one another.

8. The pressure detecting apparatus of claim 1, wherein a number of the sensing cells connected to the second driving signal lines is equal to or greater than 1 in each column.

9. The pressure detecting apparatus of claim 1, wherein the sensing cells connected to the second driving signal lines further include a second selection transistor connected to the first driving signal line.

10. A device, comprising:
an array of pressure sensing cells arranged in a plurality of rows and columns, each of the pressure sensing cells including a pressure sensing element and a selection transistor, the selection transistor having a control terminal and first and second conduction terminals, the first conduction terminal coupled to the pressure sensing element;
a first driving circuit;
a second driving circuit;
a plurality of first driving lines, each of the first driving lines positioned in a respective row of the plurality of rows, the first driving lines coupled between the first driving circuit and respective control terminals of the selection transistors of a first portion of the pressure sensing cells;
a plurality of second driving lines coupled between the second driving circuit and respective control terminals of the selection transistors of a second portion of the pressure sensing cells;
a plurality of output lines, each of the output lines disposed in a respective column of the plurality of columns and coupled to the second conduction terminals of the selection transistors in the respective column; and
a pressure detection circuit coupled to the plurality of output lines, the pressure detection circuit receives output signals from the pressure sensing cells via the output lines.

11. The device of claim wherein the first portion of the pressure sensing cells is greater in number than the second portion of the pressure sensing cells.

12. The device of claim 10, further comprising:
a control circuit coupled to the detection circuit, the first driving circuit, and the second driving circuit, the control circuit receives a pressure detection signal from the pressure detection circuit indicative of an object being in contact with one or more of the pressure sensing cells, and the control circuit selectively operates the first and the second driving circuits in one of a first driving mode and a second driving mode, based on the pressure detection signal,
wherein in the first driving mode, the first driving circuit sequentially drives each of the first driving lines, and in the second driving mode, the second driving circuit concurrently drives each of the second driving lines.

13. The device of claim 12 wherein each of the pressure sensing cells in the second portion include a second selection transistor, the second selection transistor having a control terminal coupled to a respective first driving line.

14. The device of claim 12 wherein the control circuit switches the operation of the pressure detecting apparatus from the second driving mode to the first driving mode in response to the pressure detection signal indicating that an object is in contact with one or more of the pressure sensing cells.

15. The device of claim 12 wherein the control circuit switches the operation of the pressure detecting apparatus from the first driving mode to the second driving mode in response to the pressure detection signal indicating that an object is not in contact with any of the pressure sensing cells.

16. The device of claim 10 a number of pressure sensing cells of the second portion of pressure sensing cells in each column of the array is equal to or less than one.

17. The device of claim 10 wherein a number of pressure sensing cells of the second portion of pressure sensing cells in each row of the array is equal to or greater than one.

* * * * *